United States Patent
Hsu et al.

(10) Patent No.: US 7,662,662 B2
(45) Date of Patent: Feb. 16, 2010

(54) METHOD FOR MANUFACTURING CARRIER SUBSTRATE

(75) Inventors: Jun-Chung Hsu, Ping-Chen (TW); Bing-Kuen Lin, Ta-Li (TW); Chao-Lung Wang, Taoyuan Hsien (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 497 days.

(21) Appl. No.: 11/685,751

(22) Filed: Mar. 13, 2007

(65) Prior Publication Data

US 2008/0222886 A1    Sep. 18, 2008

(51) Int. Cl.
H01L 21/00    (2006.01)
H01L 21/44    (2006.01)

(52) U.S. Cl. ............... 438/106; 438/674; 257/E23.068

(58) Field of Classification Search .......... 438/106, 438/108, 674
See application file for complete search history.

(56) References Cited

U.S. PATENT DOCUMENTS 7,485,970 B2 *   2/2009   Hsu et al. ............... 257/779
2007/0105270 A1 *   5/2007   Lee ............................ 438/106
2008/0040920 A1 *   2/2008   Brackenbury et al. ......... 29/832
2008/0088033 A1 *   4/2008   Humpston et al. .......... 257/778

* cited by examiner

Primary Examiner—Alexander G Ghyka (57) ABSTRACT

A carrier substrate and a method for manufacturing the carrier substrate are disclosed herein. The method includes the steps of: providing a core substrate; forming a build-up material layer on the core substrate; forming a via in the build-up material layer; forming a patterned photoresist layer on the build-up material layer covering a portion of the via and exposing an opening from uncovered portion of the via, and a wiring slot connected to the opening; and forming a metal-electroplated layer on the via and the wiring slot. In forming a trace according to the present invention, the metal-electroplated layer is formed as the trace and directly connected to the via, striding or not striding over the via. Additionally, in the carrier substrate structure, there is no need an annular ring to connect the trace to the via, and thus the wiring space is increased.

4 Claims, 8 Drawing Sheets

METHOD FOR MANUFACTURING CARRIER SUBSTRATE

BACKGROUND OF THE INVENTION

1. Field of the Invention

The present invention relates to a carrier substrate and a method for manufacturing the carrier substrate, and particularly to a carrier substrate having a multiple layers therein, in which a trace is directly connected to a via without using a capture ring, and a method for manufacturing the carrier substrate.

2. The Prior Arts

As the trend of compactness and lightness of electronic products and the continuously increasing demand of function, a chip used in the electronic products has a rapidly increasing number of I/O pins and packaging technology therefore is becoming more demanding. As to the packaging technology, a flip-chip technology has been widely utilized and a packaging density thereof also has a constantly rapid growth, from 90 nm to 65 nm and even to 45 nm. Meanwhile, there is a demand for a thinner wire on an IC carrier substrate, i.e. a width of the wire has to be considerably reduced from 50 μm to 20 μm (with a corresponding pitch of 40 μm) or even to 15 μm (with a corresponding pitch of 30 μm).

The IC carrier substrate has a multi-layer structure. In forming such IC carrier substrate, a build-up process is generally used to fabricate each of the multiple layers. To connect different layers there between, a blind hole is formed and processed by laser and a copper electroplating process is generally involved. According to some general design criterions, an annular ring made of metal is generally formed on a circumference of the blind hole for the following reasons. The first one is to avoid an attack on copper on a wall of the blind hole from an etchant when a wire is etched by using the etchant, which causes the copper electroplated layer to have an insufficient thickness and thus an open circuiting. The second one is to prevent a photoresist from covering the blind hole when the electroplating process according to a pattern is being undertaken, so that the electroplating process is not adversely affected. To determine a dimension of the annular ring, what an alignment extent can be achieved up to in the manufacturing process has to be considered. However, the annular ring on a fine via in between two adjacent layers in the carrier substrate is difficult to be reduced from 50 μm to 30 μm in diameter. Due to a trend of provision of an increased wiring density, the dimension of the annular ring has to be reduced, so that the pitch between wires in the carrier substrate can also be reduced to obtain an increased wiring density, wire width, or reduced carrier substrate dimension and reduced number of the build-up layers. However, the reduction of dimension of the annular ring has a limit since an alignment error may unavoidably present in the processing apparatus. Currently, the annular ring is generally designed to have a dimension of about 20 μm one side, which takes up a significant space and thus brings about an additional limit on other elements in the carrier substrate. Although the capture ring may be reduced in dimension as the alignment precision of the manufacturing apparatus is improved or a more complicated process is introduced, the cost is correspondingly increased.

To overcome the aforementioned problems, a ringless design has been suggested for the multi-layer structure. In this manner, the wiring density can be effectively increased since the annular ring is no longer to be considered, which also results in a decreased footprint. However, since the finer wires would have a considerably reduced adhesion and strength with the carrier substrate, reliability of the carrier substrate may become another problem. In this regard, there is a need for a new carrier substrate structure and a method for manufacturing the same.

SUMMARY OF THE INVENTION

A primary objective of the present invention is to provide a carrier substrate and a method for manufacturing the carrier substrate, which is of ringless design. Accordingly, more space can be saved for more wires, or increasing wire width under the same wiring density, so as to improve a process yield and effectively reduce the manufacturing cost.

The method for manufacturing a carrier substrate in accordance with the present invention comprises the steps of: providing a core substrate; forming a build-up material layer on the core substrate; forming a via in the build-up material layer; forming a patterned photoresist layer on the build-up material layer covering a portion of the via and exposing an opening from uncovered portion of the via, and a wiring slot connected to the opening; and forming a metal-electroplated layer on the via and the wiring slot.

Other advantages and efficacies of the present invention may be further appreciated after the description below with reference to the annexed drawings is read.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENT

The present invention discloses a carrier substrate and a method for manufacturing the same, which will be described below in detail with reference to the drawings.

Figure 1A:
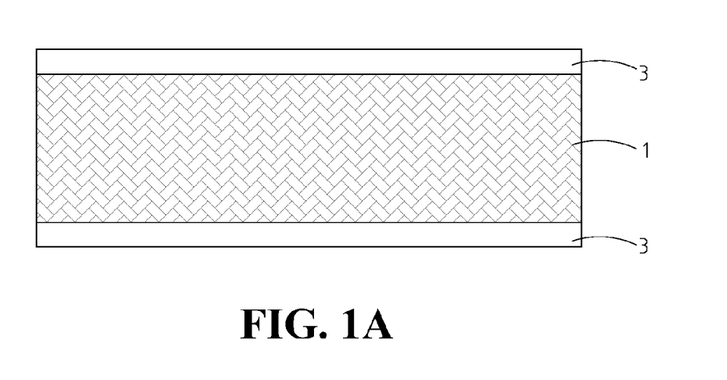
FIGS. 1A to 1K are cross sectional views of a carrier substrate, which illustrate a method for manufacturing the same, according to the present invention.
Figure 1B:
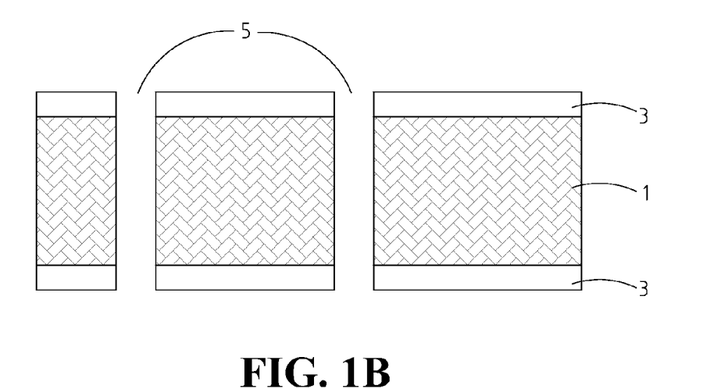
Figure 1C:
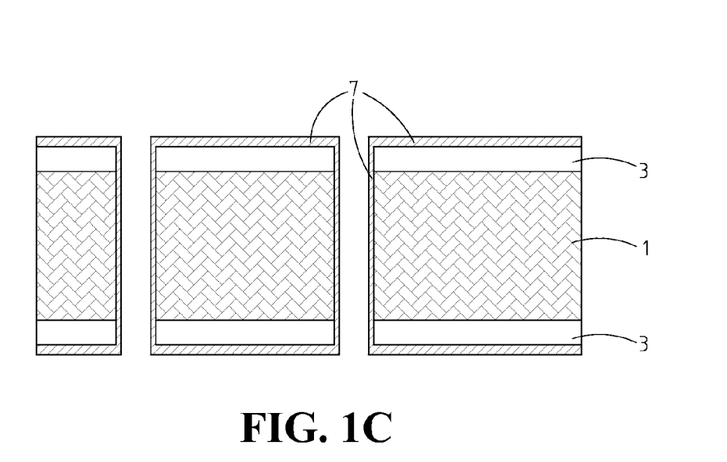

Please refer to FIGS. 1A to 1K. In manufacturing a carrier substrate in accordance with the present invention, a core substrate 1 is first provided. The core substrate 1 has a thickness of about 0.8 mm and is made of bismaleimide triazine (BT) or other organic materials, or a ceramic material. Next, a metal layer 3 is formed on the core substrate 1, which is shown in FIG. 1. The metal layer 3 has a thickness of about 1 μm to 12 μm. Then, a core through hole 5 is formed on the metal layer 3 and the core substrate 1 by, for example, a mechanical process, which is shown in FIG. 1B. The core through hole 5 has a diameter of about 100 μm to 300 μm. Thereafter, a first metal-electroplated layer 7 is formed on the metal layer 3 and a wall of the core through hole 5, which is shown in FIG. 1C. The first metal-electroplated layer 7 has a thickness of about 10 μm to 20 μm and is made of copper (Cu) in accordance with an embodiment of the present invention. Subsequently, a dry film 9 is patterned and thus formed as a mask on determined positions of the first metal-electro-plated layer 7 to form an intra-layer wiring, which is shown in FIG.

Figure 1D:
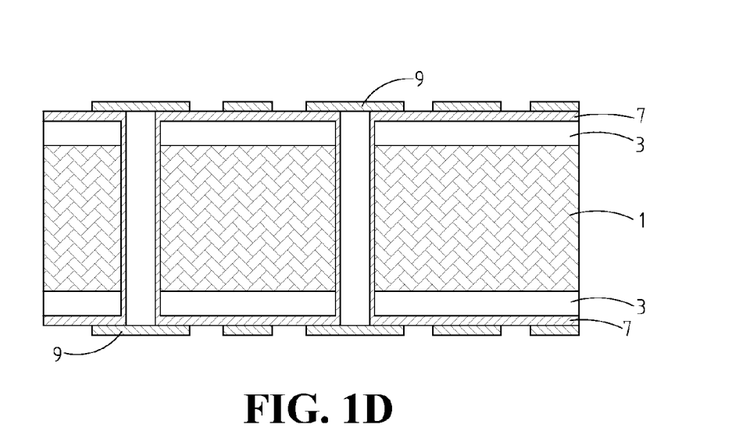
Figure 1E:
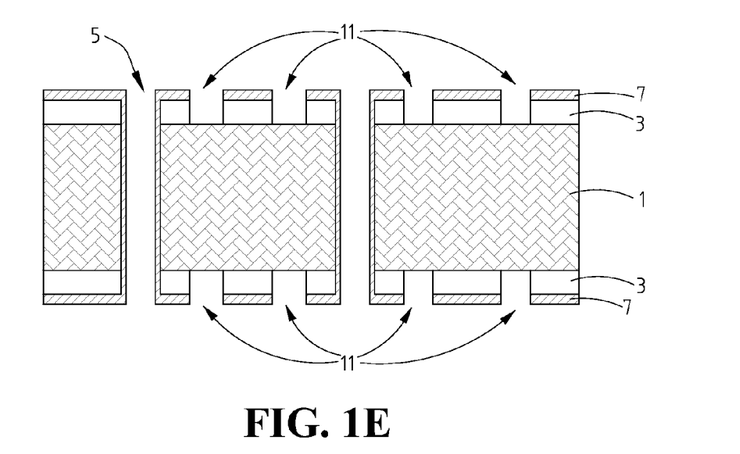
Figure 1F:
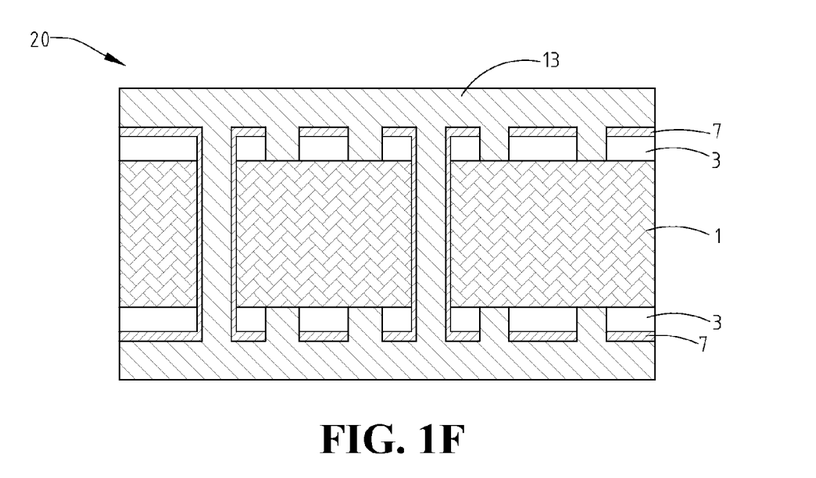

1D. As shown in FIG. 1E, respective portions of the first metal-electroplated layer 7 and the metal layer 3 are removed until the core substrate 1 is exposed, by the use of the patterned dry films 9, to form openings 11 for the intra-layer wiring, in which the remained portions of the first metal electroplated layer 7 and the metal layer 3 become intra-layer wires. Then, a build-up material layer 13 is formed on and cover the first metal-electroplated layer 7, the openings 11 for the intra-layer wiring, and the core through hole 5, which is shown in FIG. 1F. Additionally, a process of filling a resin in the core through hole 5 may be further provided.

Figure 1G:
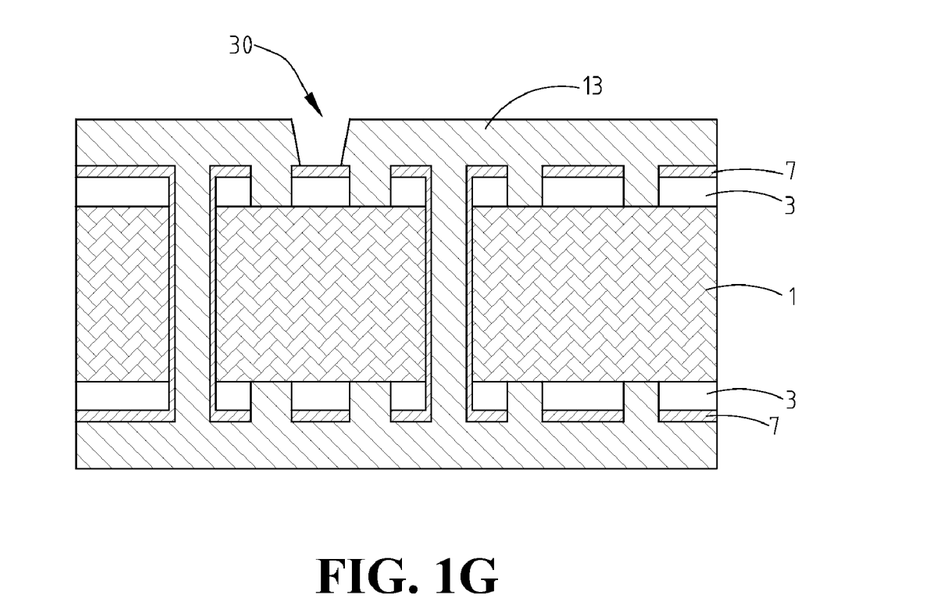
Figure 1H:
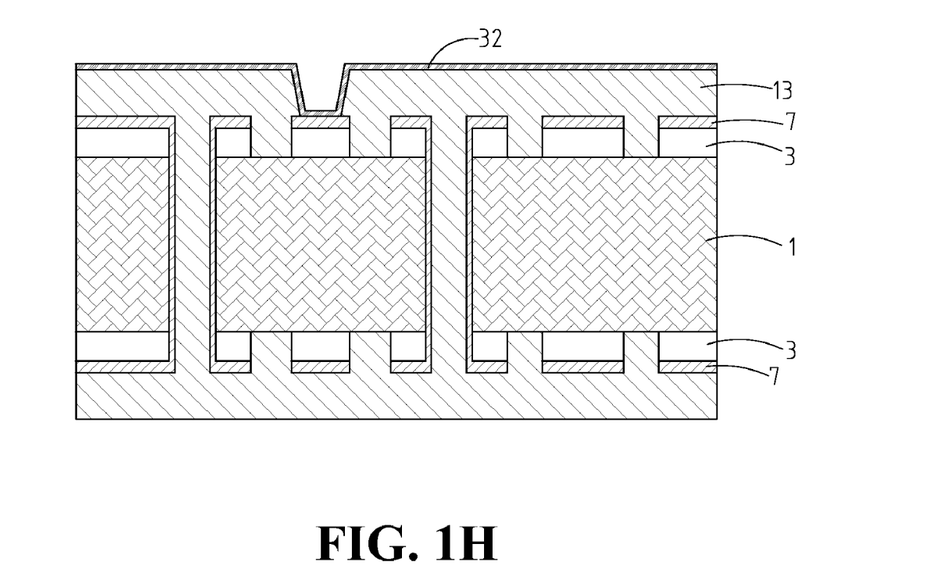
Figure 1I:
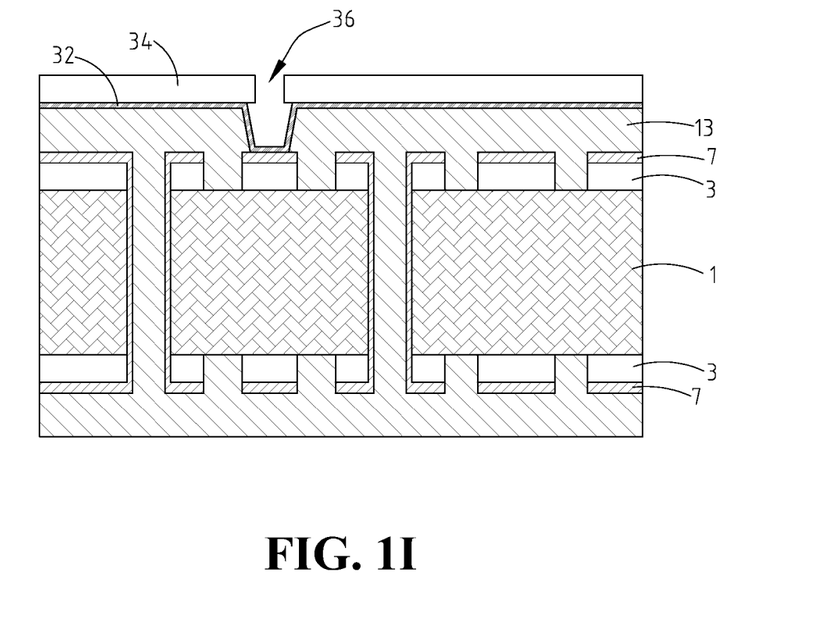
Figure 1J:
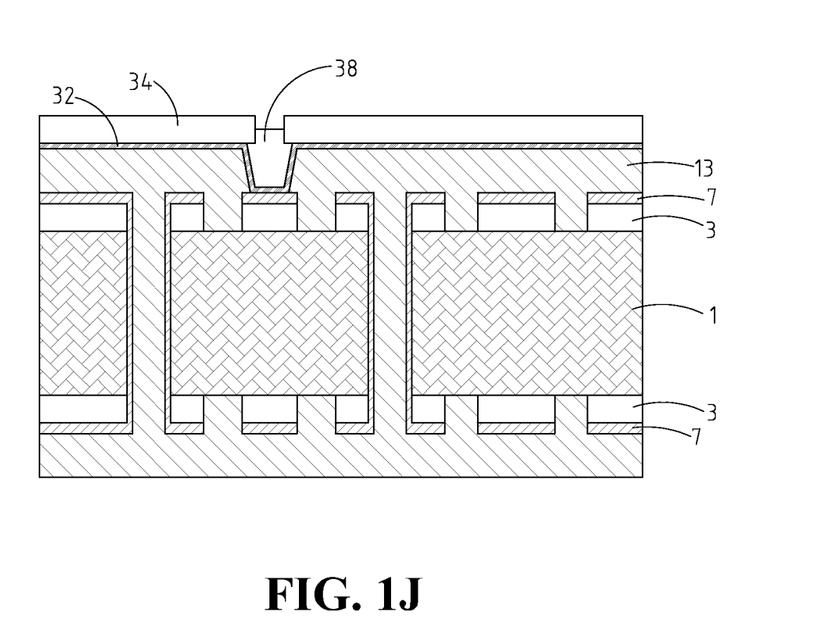
Figure 1K:
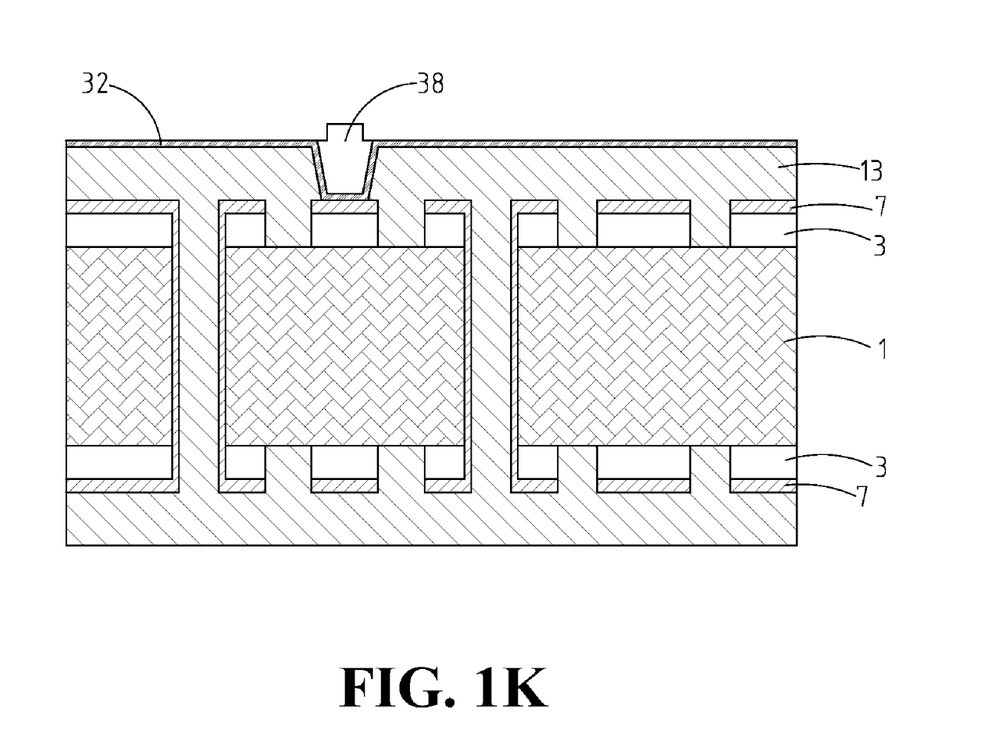

The above mentioned steps are performed for formation of a carrier substrate in the prior art. In the present invention, additional steps are performed thereafter. First, a via 30 is formed on the build-up material layer 13, which is shown in FIG. 1G. Next, a conductive metal layer 32 is deposited on the build-up material layer 13, which is shown in FIG. 1H. Then, a patterned photoresist layer 34 having an opening 36 thereon is formed on the conductive metal layer 32, which is shown in FIG. 1I. Thereafter, a second metal-electroplated metal layer 38 is formed in the opening 36 and a wiring slot 38a (see FIG. 2A), which is shown in FIG. 1J. Finally, the patterned photoresist layer 34 is removed and the carrier substrate of the present invention is thus formed (see FIG. 1K). Among the above mentioned steps of FIGS. 1I to 1K, the corresponding structures can also be seen in FIGS. 2A to 2C, which are top views corresponding thereto. Further, the actual structure of the carrier substrate shown in FIG. 1K is also presented in FIG. 3, which is obtained by a microscope with a magnification of 1,000 times. In the carrier substrate according to the present invention, instead of designing an annular ring to connect a trace with the via in the prior art, the trace (the second metal-electroplated layer 38) is directly connected to, striding or not striding over, the via 30.

Figure 2A:
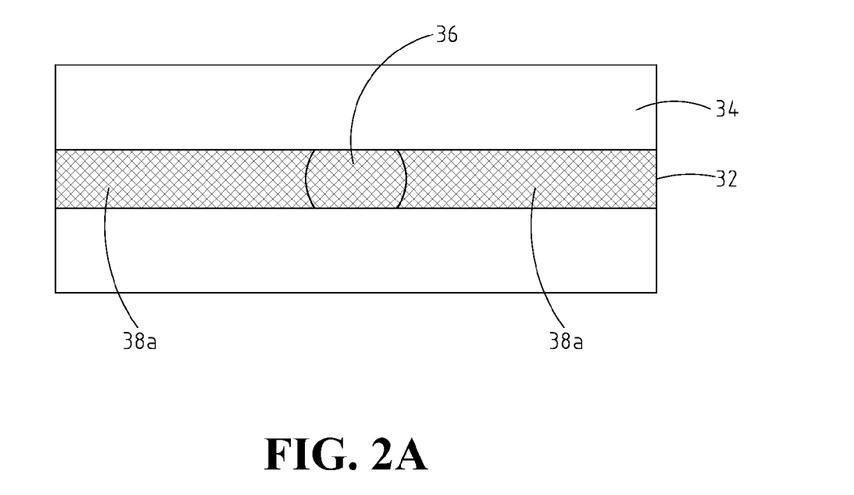
FIGS. 2A to 2C are top views of the carrier substrate shown in FIGS. 1I to 1K according to the present invention.
Figure 2B:
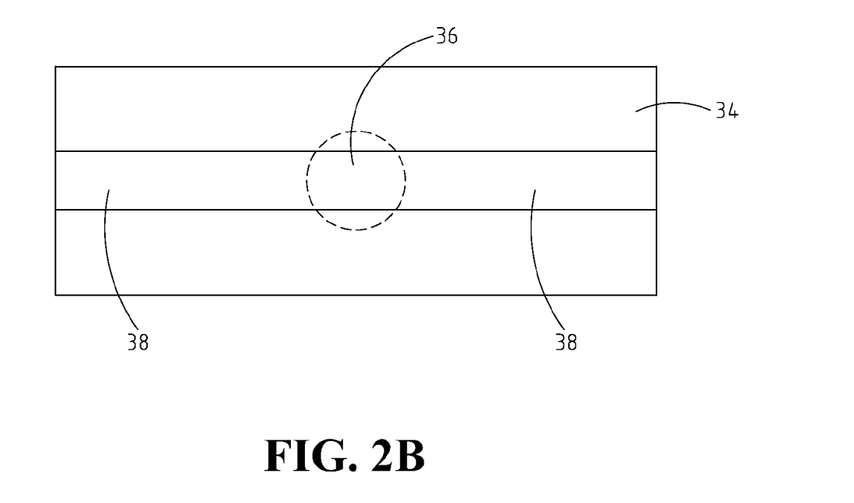
Figure 2C:
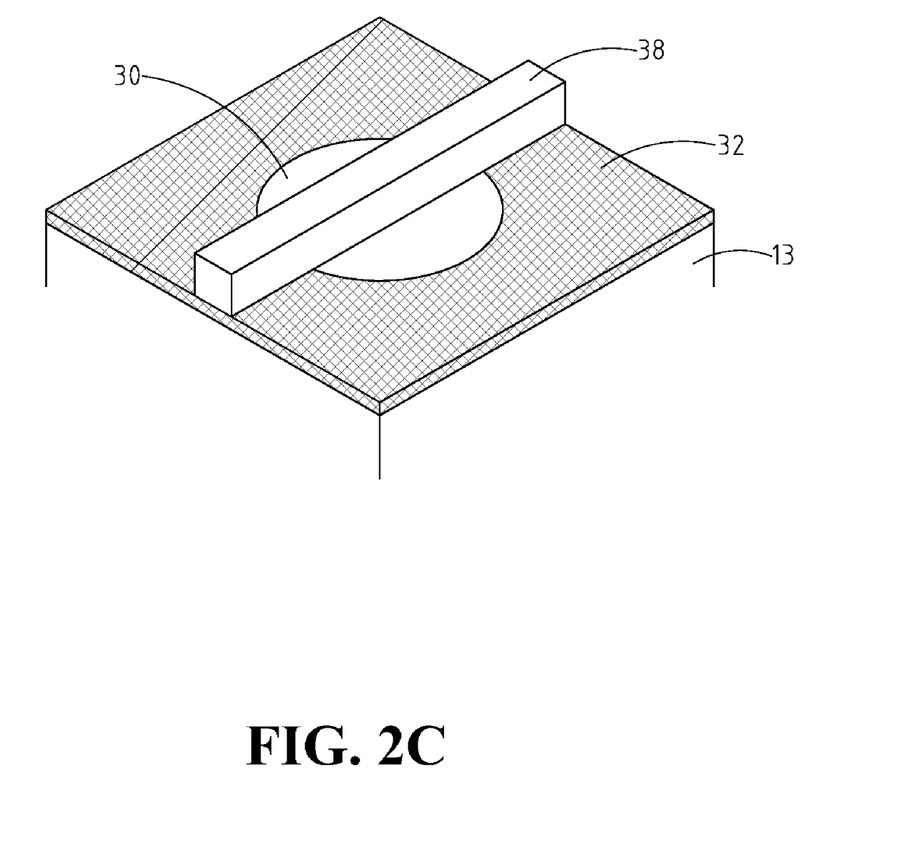
Figure 3:
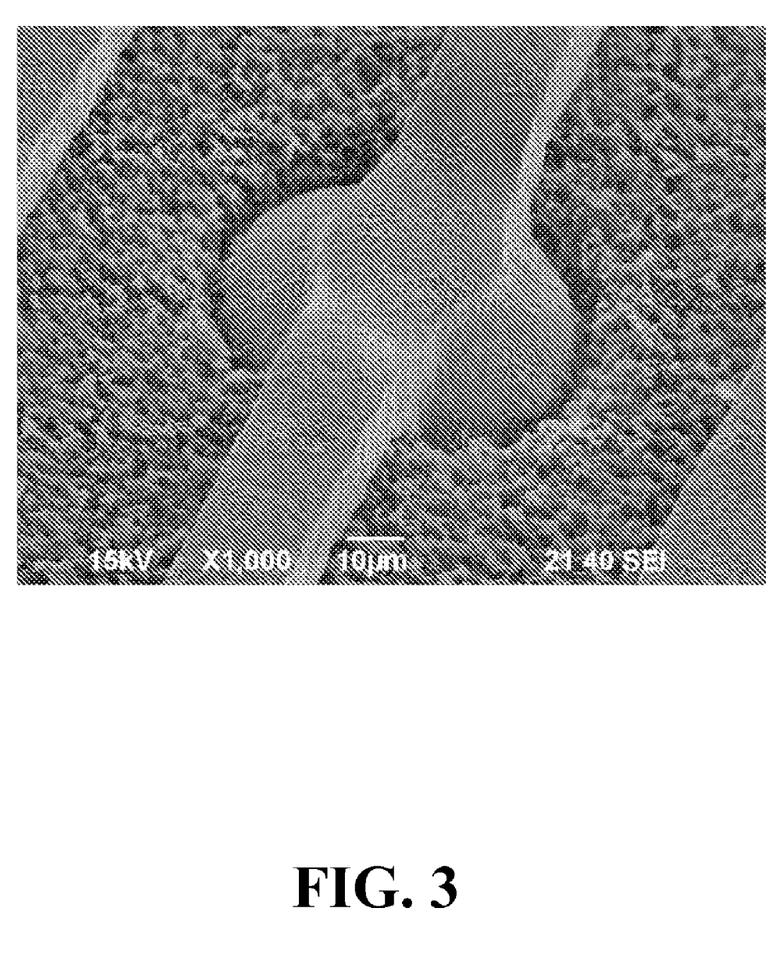
FIG. 3 is a picture showing the structure of the carrier substrate according to the present invention shown in FIG. 1K and FIG. 2C.

To manufacture the particular structure as shown in FIG. 2C, the following should be noted. As shown in FIG. 1I or FIG. 2A, the patterned photoresist layer 34 covers only a portion of the via 30 and thus the opening 36 is exposed. The wiring slot 38a is connected to the opening 36 of the photoresist layer 34. Thus, the patterned photoresist layer 34 overhangs on an edge of the via 30. The overhung portion of the patterned photoresist layer 34 depends on how precise the processing apparatus can achieve in alignment, in which the length of the overhung portion is typically about 10 μm to 20 μm. In addition, the second metal-electroplated layer 38 can be formed to, or not to, stride over the via 30. In either case, the photoresist layer 34 has a diameter of the opening 36 less than that of the via 30.

When the structure shown in FIG. 2C is used as a bump pad, it provides with a protruding contact with a solder to be welded thereto, and thus effectively provides with an enhanced binding there between. Additionally, the ringless design in the present invention has also the advantage of increasing the wiring space.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A method for manufacturing a carrier substrate, comprising the steps of:
   providing a core substrate;
   forming a build-up material layer on the core substrate;
   forming a via in the build-up material layer;
   forming a patterned photoresist layer on the build-up material layer covering a portion of the via and exposing an opening from uncovered portion of the via, and a wiring slot connected to the opening; and
   forming a metal-electroplated layer on the via and the wiring slot;
   wherein the wiring slot is formed and connected to two ends of the opening of the patterned photoresist layer, and a trace is formed to stride over the via by the step of forming the metal-electroplated layer on the opening of the patterned photoresist layer and the wiring slot.

2. The method as claimed in claim 1, wherein the opening of the photoresist layer has a diameter less than that of the via.

3. A method for manufacturing a carrier substrate, comprising the steps of:
   providing a core substrate;
   forming a build-up material layer on the core substrate;
   forming a via in the build-up material layer;
   forming a patterned photoresist layer on the build-up material layer covering a portion of the via and exposing an opening from uncovered portion of the via, and a wiring slot connected to the opening; and
   forming a metal-electroplated layer on the via and the wiring slot;
   wherein the wiring slot is formed and connected to predetermined positions of the opening of the patterned photoresist layer, and a trace is formed and connected to the via by the step of forming the metal-electroplated layer on the opening of the patterned photoresist layer and the wiring slot.

4. The method as claimed in claim 3, wherein the opening of the photoresist layer has a diameter less than that of the via.

* * * * *